(12) United States Patent
Sano et al.

(10) Patent No.: US 8,013,621 B2
(45) Date of Patent: Sep. 6, 2011

(54) INSPECTION METHOD AND PROGRAM FOR INSPECTING ELECTRICAL CHARACTERISTICS OF A SEMICONDUCTOR WAFER

(75) Inventors: Satoshi Sano, Nirasaki (JP); Daiki Kurihara, Kyoto (JP)

(73) Assignee: Tokyo Electron Limited, Tokyo (JP)

( * ) Notice: Subject to any disclaimer, the term of this patent is extended or adjusted under 35 U.S.C. 154(b) by 246 days.

(21) Appl. No.: 12/358,796

(22) Filed: Jan. 23, 2009

(65) Prior Publication Data

US 2009/0184729 A1    Jul. 23, 2009

(30) Foreign Application Priority Data

Jan. 23, 2008  (JP) ................................. 2008-012783

(51) Int. Cl.
*G01R 31/308* (2006.01)
(52) U.S. Cl. ........... 324/750.23; 324/750.16; 324/754.1; 324/754.11; 702/150; 382/151
(58) Field of Classification Search ............. 324/750.23, 324/754.1, 750.16
See application file for complete search history.

(56) References Cited

U.S. PATENT DOCUMENTS

| | | | | |
|---|---|---|---|---|
| 5,644,245 A | * | 7/1997 | Saitoh et al. | 324/750.18 |
| 6,414,477 B1 | * | 7/2002 | Strom | 702/104 |
| 7,501,843 B2 | * | 3/2009 | Takahashi et al. | 324/750.19 |
| 7,589,544 B2 | * | 9/2009 | Nakayama | 324/750.23 |

FOREIGN PATENT DOCUMENTS

| | | | | |
|---|---|---|---|---|
| JP | 05-036765 | * | 2/1993 | 15/62 |
| JP | 07-288270 | * | 10/1995 | 1/73 |
| JP | 2006-278381 | * | 10/2006 | 31/26 |
| JP | 2006-339196 | * | 12/2006 | 31/28 |

* cited by examiner

*Primary Examiner* — Huy Phan
*Assistant Examiner* — Richard Isla Rodas
(74) *Attorney, Agent, or Firm* — Oblon, Spivak, McClelland, Maier & Neustadt, L.L.P.

(57) ABSTRACT

Disclosed is an inspection method capable of performing an inspection of high reliability even for very fine and thin-film electrode pads of a target object, by using needle traces formed on the electrode pads and making the electrode pads repeatedly contact the probes at high accuracy. In the inspection method, under the control of a control unit 15 of an inspection apparatus 10, by using old needle traces formed on the respective pads P of the target object such as a semiconductor wafer W, contactable regions S for the probes 12A in preparation for a present inspection, so that each of the probes 12A contact each of the electrode pad P in the contactable region S and within an empty area with no needle trace.

23 Claims, 13 Drawing Sheets

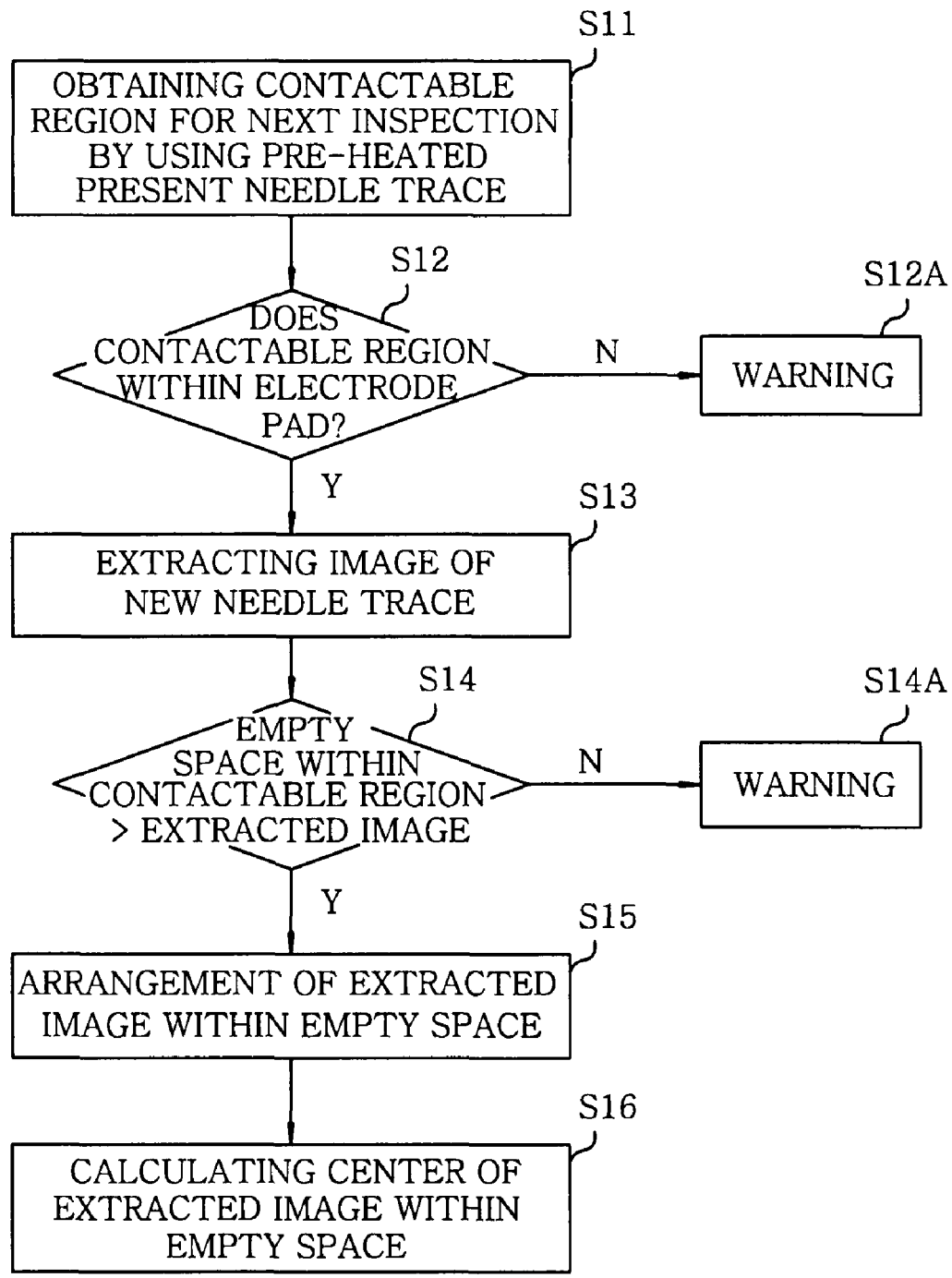

INSPECTION METHOD AND PROGRAM FOR INSPECTING ELECTRICAL CHARACTERISTICS OF A SEMICONDUCTOR WAFER

FIELD OF THE INVENTION

The present invention relates to an inspection method for inspecting the electrical characteristics of a target object such as a semiconductor wafer or the like by using a probe card and a program storage medium storing the inspection method, and more specifically, to an inspection method with enhanced inspection reliability and a program storage medium storing the inspection method.

BACKGROUND OF THE INVENTION

An inspection apparatus includes a loader chamber and a prober chamber arranged adjacent to each other. The loader chamber includes a containing unit for containing target objects to be inspected (e.g., semiconductor wafers) in the unit of cassette, a semiconductor wafer transfer mechanism for transferring semiconductor wafers from the cassette one by one, and a sub-chuck for prealigning semiconductor wafers in the course of transfer. The prober chamber includes a movable main chuck for mounting a semiconductor wafer that has been transferred by the wafer transfer mechanism in the loader chamber, the temperature of the main chuck being adjustable, a probe card arranged above the main chuck, and an alignment mechanism for performing alignment of probes of the probe card and electrode pads of each device formed on the semiconductor wafer on the main chuck. After aligning the electrode pads of the semiconductor wafer and the probes through the alignment mechanism, the temperature of the semiconductor wafer is set to a predetermined level through the main chuck so that the electrical characteristics of the target object are inspected at the set temperature.

In case where the electrical characteristics of every device of the semiconductor wafer are inspected, a photographing unit (e.g., CCD camera) in the alignment mechanism is used to photograph an image of a device including electrode pads on the semiconductor wafer as well as an image of needle tips of the probes of the probe card, and the electrode pads and the probes are aligned based on position information thereof. Next, the semiconductor wafer is lifted by a predetermined distance through a mounting table and overdriven to make electrical contact between the electrode pads and the probes to thereby inspect electrical characteristics of the device. However, to keep abreast with the trend of high integration of the device, electrode pads have been made markedly finer and at the same time, the number of pads and the number of probes of the probe card have been markedly increased. Therefore, it becomes difficult for the CCD camera to detect probes during the alignment.

However, while the inspection is repeated, the positions of the needle tips shift by deformation of the probes. When the positions of the needle tips gradually ascend due to deformation of the probes, there may occur the failure of electrical communication between the probes and the electrode pads even when the semiconductor wafer is overdriven. Therefore, Japanese Patent Laid-open Publication No. H5-036765 discloses a prober capable of conducting a stable inspection, wherein a needle trace formed on an actual pad is recognized by a camera to be compared with a reference one, and, if the position of a needle tip ascends, the main chuck is raised to give proper overdrive amounts all the time based on the comparison result.

Japanese Patent Laid-open Publication No. H7-288270 describes an inspection apparatus which obtains position deviation information from a contact state between a virtual pad (design pad) and a probe, so as to virtually monitor a contact state between an actual pad and the probe in advance and correct it to an optimum contact state based on the result from the contact state.

Japanese Patent Laid-open Publication No. 2006-339196 describes a prober, which detects the position of a needle and the position of an electrode, displays an image of a needle trace and a needle trace mark showing the position of the needle trace on a display device, and calculates the positional deviation of the needle trace mark. An operator corrects the position of the needle trace mark on the image, calculates the positional deviation of the needle trace mark, and corrects a movement amount computation corrected value of a semiconductor wafer based on the calculated deviation.

Japanese Patent Laid-open Publication No. 2006-278381 discloses an inspection apparatus wherein, based on the position of needle marks formed on an electrode pad, an amount of deviation of a probe to be contacted subsequently is obtained. Also, in this inspection apparatus, a probe is brought into contact with an electrode pad having thereon an existing needle trace, and then an image after contact which shows a region including the electrode pad is acquired. The image is compared with an image before contact to acquire a newest needle trace, and the amount of positional deviation is corrected using the newest needle trace. The positional deviation amount is then used for the subsequent inspection.

As described above, in all of the conventional techniques, the positional deviation of the electrode pads and the probes can be corrected by acquiring the amount of positional deviation of the electrodes and the probes. However, this correction does not guarantee sure contact between the probes and the electrode pads. Moreover, even though the contact is made, if new needle traces are repeatedly formed on existing needle traces, the electrode pad and the device may be damaged.

SUMMARY OF THE INVENTION

The present invention provides an inspection method capable of performing an inspection of high reliability even for very fine and thin-film electrode pads of a target object, by using needle traces formed on the electrode pads and making the electrode pads repeatedly contact the probes at high accuracy, and a program storage medium storing the inspection method.

The present invention further provides an inspection method capable of performing an inspection of high reliability even for very fine and thin-film electrode pads of a target object, by using needle traces formed on the electrode pads and making the electrode pads repeatedly contact the probes at high accuracy without causing damages to the pads, and a program storage medium storing the inspection method.

In accordance with a first aspect of the present invention, there is provided an inspection method for inspecting electrical characteristics of a target object by bringing electrode pads of the target object placed on a mounting table in electrical contact with probes of a probe card arranged above the mounting table, the method including: a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection including: a first step of obtaining a first image by photographing the electrode pads to detect the needle trace formed on each of the electrode pads; a second step of obtaining an amount of positional deviation between the center of each of the electrode pads and the center of gravity of each of the needle traces on the electrode pads by using the first image; a third step of correcting contact positions of the probes used for the present inspection with the electrode pads to the centers of the electrode pads, respectively, by using the positions of the needle traces and the amount of positional deviation thereof; a fourth step of bringing the probes that are used for the present inspection in contact with the electrode pads after the correction in the third step to form a new needle trace on each of the electrode pads; a fifth step of obtaining a second image by photographing the electrode pads on which the new needle traces are respectively formed; and a sixth step of obtaining a contactable region for each of the probes in each of the electrode pads, based on size of the electrode pads and center of gravity of the new needle trace formed on each of the electrode pads.

In accordance with a second aspect of the present invention, there is provided an inspection method for inspecting electrical characteristics of a target object by bringing electrode pads of the target object placed on a mounting table in electrical contact with probes of a probe card arranged above the mounting table, the method including: a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection including: a first step of obtaining a first image by photographing the electrode pads to detect the needle trace formed on each of the electrode pads; a second step of obtaining an amount of positional deviation between the center of each of the electrode pads and the center of gravity of each of the needle traces on the electrode pads by using the first image; a third step of correcting contact positions of the probes used for the present inspection with the electrode pads to the centers of the electrode pads, respectively, by using the positions of the needle traces and the amount of positional deviation thereof; a fourth step of bringing the probes that are used for the present inspection in contact with the electrode pads after the correction in the third step to form a new needle trace on each of the electrode pads; a fifth step of obtaining a second image by photographing the electrode pads on which the new needle traces are respectively formed; a sixth step of comparing the first image with the second image to extract an image of the new needle trace of each of the electrode pads, obtaining expected contact positions for the probes to make contact during a next inspection by using an amount of positional deviation between the center of each of the electrode pads and the center of gravity of each of the new needle traces on the electrode pads, comparing the expected contact positions with respective empty areas with no needle trace of the corresponding second image, and, if the expected contact positions are included in the respective empty areas, arranging the expected contact positions in the respective empty areas to obtain the centers of gravity thereof; and a seventh step of correcting the contact position of each of the probes to the center of each of the expected contact positions arranged in the respective empty areas.

In accordance with a third aspect of the present invention, there is provided an inspection method for inspecting electrical characteristics of a target object by bringing electrode pads of the target object placed on a mounting table in electrical contact with probes of a probe card arranged above the mounting table, the method including: a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection including: a first step of obtaining a first image by photographing the electrode pads to detect the needle trace formed on each of the electrode pads; a second step of obtaining an amount of positional deviation between the center of each of the electrode pads and the center of gravity of each of the needle traces on the electrode pads by using the first image; a third step of correcting contact positions of the probes used for the present inspection with the electrode pads to the centers of the electrode pads, respectively, by using the positions of the needle traces and the amount of positional deviation thereof; a fourth step of bringing the probes that are used for the present inspection in contact with the electrode pads after the correction in the third step to form a new needle trace on each of the electrode pads; a fifth step of obtaining a second image by photographing the electrode pads on which the new needle traces are respectively formed; a sixth step of obtaining a contactable region for each of the probes in each of the electrode pads, based on size of the electrode pads and center of gravity of the new needle trace formed on each of the electrode pads; a seventh step of judging whether or not the contactable regions are included in the respective electrode pads; an eighth step of extracting an image of the new needle trace of each of the electrode pads based on the first image and the second image if the contactable regions are included in the respective electrode pads; and an ninth step of obtaining expected contact positions for the probes to make contact during a next inspection by using an amount of positional deviation between the center of each of the electrode pads and the center of gravity of each of the new needle traces on the electrode pads, comparing the expected contact positions with respective empty areas with no needle trace in the contactable regions, and, if the expected contact positions are included in the respective empty areas, arranging the expected contact positions in the respective empty areas to obtain the centers of gravity thereof as contact positions for the respective probes.

In accordance with a fourth aspect of the present invention, there is provided an inspection method for inspecting electrical characteristics of a target object by bringing electrode pads of the target object placed on a mounting table in electrical contact with probes of a probe card arranged above the mounting table, the method including: a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection including: a first step of obtaining a first image by photographing the electrode pads to detect the needle trace formed on each of the electrode pads; a second step of obtaining an amount of positional deviation between the center of each of the electrode pads and the center of gravity of each of the needle traces on the electrode pads by using the first image; a third step of correcting contact positions of the probes used for the present inspection with the electrode pads to the centers of the electrode pads, respectively, by using the positions of the needle traces and the amount of positional deviation thereof; a fourth step of bringing the probes that are used for the present inspection in contact with the electrode pads after the correction in the third step to form a new needle trace on each of the electrode pads; a fifth step of obtaining a second image by photographing the electrode pads on which the new needle traces are respectively formed; a sixth step of comparing the first image with the second image to extract an image of the new needle trace of each of the electrode pads, obtaining expected contact positions for the probes to make contact during a next inspection, by following similar procedures to the first to third steps based on the center of gravity of each of the extracted images and the center of each of the electrode pads, a seventh step of correcting the expected contact position by moving it by a minimum distance to a position where the overlap becomes a minimum if the extracted image arranged at each of the expected contact positions overlaps with the existing needle traces.

In accordance with a fifth aspect of the present invention, there is provided an inspection method for inspecting electrical characteristics of a target object by bringing electrode pads of the target object placed on a mounting table in electrical contact with probes of a probe card arranged above the mounting table, the method including: a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection including: a first step of obtaining a first image by photographing the electrode pads to detect the needle trace formed on each of the electrode pads; a second step of obtaining an amount of positional deviation between the center of each of the electrode pads and the center of gravity of each of the needle traces on the electrode pads by using the first image; a third step of correcting contact positions of the probes used for the present inspection with the electrode pads to the centers of the electrode pads, respectively, by using the positions of the needle traces and the amount of positional deviation thereof; a fourth step of bringing the probes that are used for the present inspection in contact with the electrode pads after the correction in the third step to form a new needle trace on each of the electrode pads; a fifth step of obtaining a second image by photographing the electrode pads on which the new needle traces are respectively formed; a sixth step of comparing the first image with the second image to extract an image of the new needle trace of each of the electrode pads, obtaining expected contact positions for the probes to make contact during a next inspection, by following similar procedures to the first to third steps based on the center of gravity of each of the extracted images and the center of each of the electrode pads, a seventh step of plotting a Voronoi diagram based on the existing needle traces in each of the electrode pads of the second image, and moving the center of gravity of each of the extracted images arranged at the respective expected contact positions to a closest Voronoi border by a minimum distance to thereby correct each of the expected contact position.

Preferably, the new needle trace is formed using the target object set to a predetermined temperature in advance.

Preferably, the amount of positional deviation obtained in the second step is calculated by a least squares method using the center of the electrode pads and the center of gravity of the needle trace formed on each of the electrode pads.

In the first and the third aspect, preferably, a range of a x-coordinate of the contactable region that is obtained in the sixth step is determined by setting the center of the electrode pads as an origin, with a minimum x-coordinate being a greater x-coordinate between a corrected x-coordinate which is obtained by adding a half width of the new needle trace in the X direction to a x-coordinate of an edge on the minus side of the electrode pad and an added x-coordinate which is obtained by adding a x-coordinate of the center of gravity of the new needle trace having a maximum x-coordinate to the corrected x-coordinate, with a maximum x-coordinate being a smaller x-coordinate between a x-coordinate of an edge on the plus side of the electrode pad and an added x-coordinate which is obtained by adding a x-coordinate of the center of gravity of the new needle trace having a maximum x-coordinate to the edge; and a range of a y-coordinate of the contactable region is determined in a similar manner used for the x-coordinate range.

In accordance with a sixth aspect of the present invention, there is provided a program storage medium storing a program for executing, on a computer, an inspection method for inspecting electrical characteristics of a target object by bringing electrode pads of the target object placed on a mounting table in electrical contact with probes of a probe card arranged above the mounting table, the method including: a process of correcting contact positions between the electrode pads and the probes in preparation for a present inspection, using needle traces of the probes that are formed on the electrode pads, respectively, in a previous inspection, wherein the program activates the computer to execute any one of the inspection methods described above, when the contact positions between the electrode pads and the respective probes are corrected using the needle traces.

BRIEF DESCRIPTION OF THE DRAWINGS

The objects and features of the present invention will become apparent from the following description of preferred embodiments, given in conjunction with the accompanying drawings, in which:

FIG. 3 is a flow chart for explaining a part of the flow chart in FIG. 2 in more detail;

FIGS. 4A and 4B show plan views describing the correction of the amount of positional deviation based on the needle traces of probes on electrode pads of each device, in which FIG. 4A shows old probe needle traces and FIG. 4B shows ideal probe needle traces;

DETAILED DESCRIPTION OF THE EMBODIMENTS

Hereinafter, embodiments of an inspection apparatus and an inspection method in accordance with the present invention will be described in detail with reference to accompanying drawings.

First Embodiment

Figure 1:
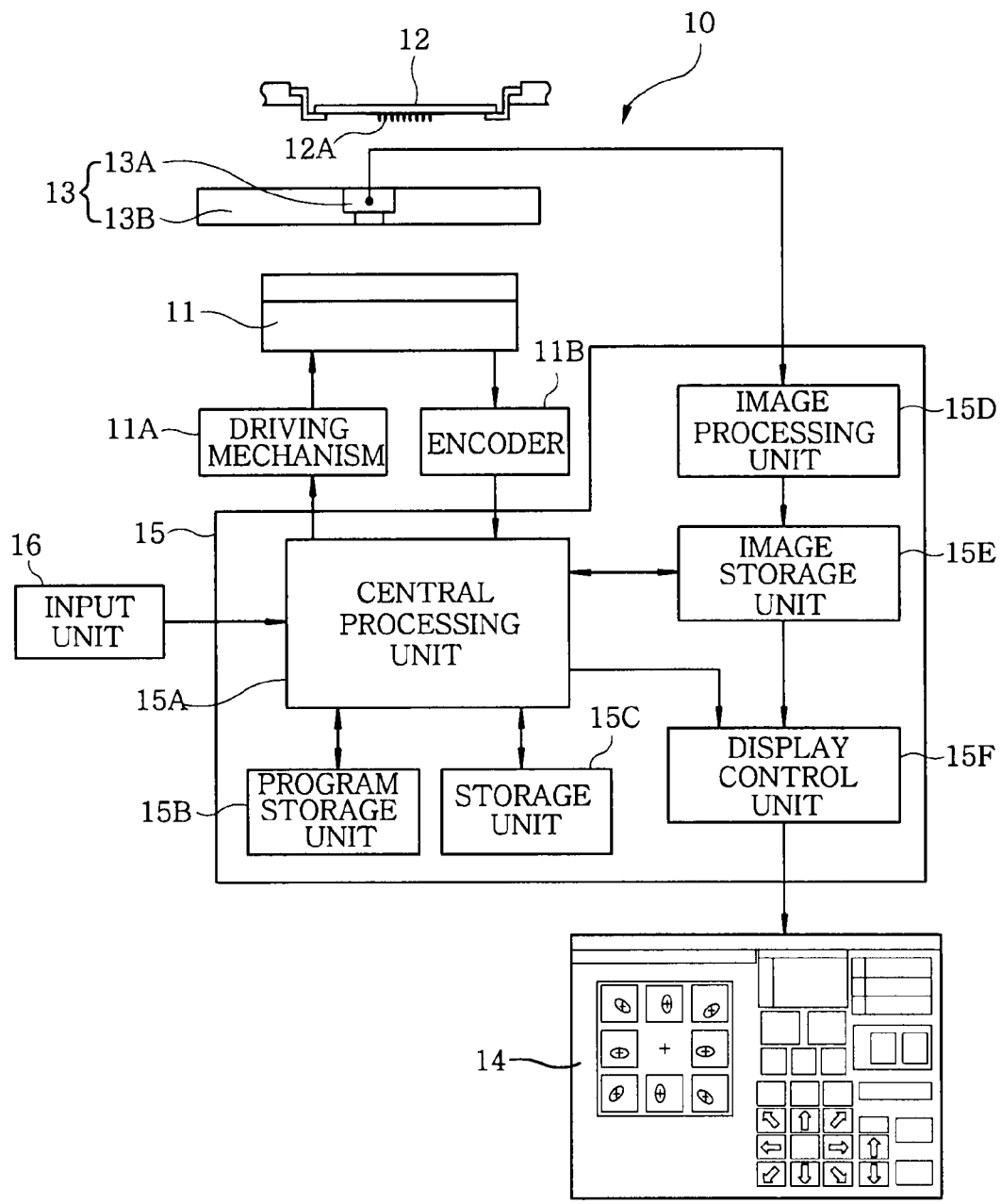
FIG. 1 is a block diagram showing the configuration of an inspection apparatus used for performing an inspection method in accordance with a first embodiment of the present invention.

First, an inspection apparatus having a program storage medium storing an inspection method in accordance with a first embodiment of the present invention will be explained. Referring to FIG. 1, the inspection apparatus 10, for example, includes a movable mounting table 11 for mounting thereon a semiconductor wafer W as a target object to be inspected, the mounting table 11 having a built-in temperature regulation mechanism, a probe card 12 arranged above the mounting table 11, an alignment mechanism 13 for aligning probes 12A of the probe card 12 and the semiconductor wafer W on the mounting table 11, a photographing unit (e.g., CCD camera) 13A constituting the alignment mechanism 13, a display device having a display screen 14 to display an image photographed by the CCD camera 13A, and a control device 15 having mainly a computer to control the aforementioned components. Under the control of the control device 15, the alignment mechanism 13 aligns the semiconductor wafer W on the mounting table 11 and the probes 12A of the probe card 12 and brings the probes 12A into electrical contact with the semiconductor wafer W to inspect electrical characteristics of the semiconductor wafer W.

As shown in FIG. 1, the inspection apparatus 10 includes the display screen 14, and an input unit 16 such as a keyboard. The input unit 16 is used for inputting various inspection conditions to perform the inspection method of the present invention, and the display screen 14 is utilized for activating a menu or an icon displayed thereon for executing a variety of programs.

The mounting table 11, as shown in FIG. 1, is provided with a drive mechanism 11A and a detector (e.g., an encoder) 11B, which is configured to move in X, Y, Z and θ directions through the drive mechanism 11A and detect a moving amount through the encoder 11B. The drive mechanism 11A is provided with a horizontal drive mechanism (not shown) having, e.g., a motor and a ball screw to drive an XY table where the mounting table 11 is arranged, a vertical drive mechanism provided to the mounting table 11, and a θ drive mechanism for rotating the mounting table 11 in the θ direction. The encoder 11B detects moving distances of the XY table in the X and Y directions based on the rotating number of the motor, and sends detection signals to the control device 15. The control device 15 controls the drive mechanism 11A based on the signals from the encoder 11B, thereby controlling the moving amount of the mounting table 11 in the X and Y directions.

The alignment mechanism 13 is provided with the CCD camera 13A set forth above, and an alignment bridge 13B. As shown in FIG. 1, the CCD camera 13A is installed at the alignment bridge 13B. The CCD camera 13A has a zoom function and photographs a semiconductor wafer W at a predetermined magnification.

The CCD camera 13A gets to the probe center from the rear surface of the prober chamber via the alignment bridge 13B and is placed between the probe card 12 and the mounting table 11. While the mounting table 11 moves in the X or Y directions, the CCD camera 13A photographs a semiconductor wafer W from above at a predetermined magnification, and sends a photographed image signal to the control device 15. Under the control of the control device 15, the image of the semiconductor wafer is displayed on the display screen 14.

The control device 15 is provided with a central processing unit 15A, a program storage unit 15B for storing a variety of programs including a program for executing the inspection method of the present invention, a storage unit 15C for storing all kinds of data, an image processing unit 15D for image processing a photographed image signal from the CCD camera 13A, an image storage unit 15E for storing the image signal from the image processing unit 15D as image data, and a display control unit 15F for displaying the photographed image on the display screen 14 based on the image signal. The control device 15 transmits and receives signals among the central processing unit 15A, the program storage unit 15B, and the storage unit 15C to control all of the components of the inspection apparatus 10.

The central processing unit 15A is connected to the input unit 16 to process various data signals input from the input unit 16, and stores them in the storage unit 15C. In the embodiment of the present invention, the program storage unit 15B stores a program for performing the inspection method of the present invention, and the display screen 14 displays a photographed image and an operation panel. The operation panel, as will be described later, has functions of operating the motion of the CCD camera 13A prior to the alignment, or registering image information such as position data of the probe card 12. That is, when horizontal shift keys of the operation panel 14B are manipulated, the CCD camera 13A is configured to move in the X and Y directions; and when vertical shift keys thereof are manipulated, the CCD camera 13A is configured to move in the Z direction.

Also, the central processing unit 15A is connected to the image storage unit 15E and the display control unit 15F, and photographed images from the CCD camera 13A are displayed on the display screen 14 under the control of the central processing unit 15A and the display control unit 15F. Besides the currently photographed images from the CCD camera 13A, previously photographed images and processed images can be stored in the image storage unit 15E.

Various programs including the program for the inspection method of the present invention are stored in the program storage unit 15B through various storage media. These programs can also be downloaded through a communication medium to various inspection apparatuses. In this embodiment, the inspection method program stored in the program storage unit 15B is executed.

Next, the inspection method in accordance with the first embodiment of the present invention will be explained with reference to FIGS. 2 to 6. The inspection method of this embodiment is characterized by utilizing a needle trace inspection function of the inspection apparatus 10 to correct contact positions of the probes prior to a present inspection by using existing needle traces (hereinafter, referred to as "old needle traces") formed on electrode pads during a previous inspection; bringing the probes in contact with the electrode pads to form new needle traces (hereinafter, referred to as "new needle traces"); and obtaining optimal contact positions for a next inspection based on the new needle traces. Therefore, a semiconductor wafer W used for the inspection method of this embodiment has been subjected to the electrical characteristics inspection at least once, so that at least one probe needle trace has been formed on each of the electrode pads of the devices. Further, the present inspection uses the same probe card used for the previous inspection.

Figure 2:
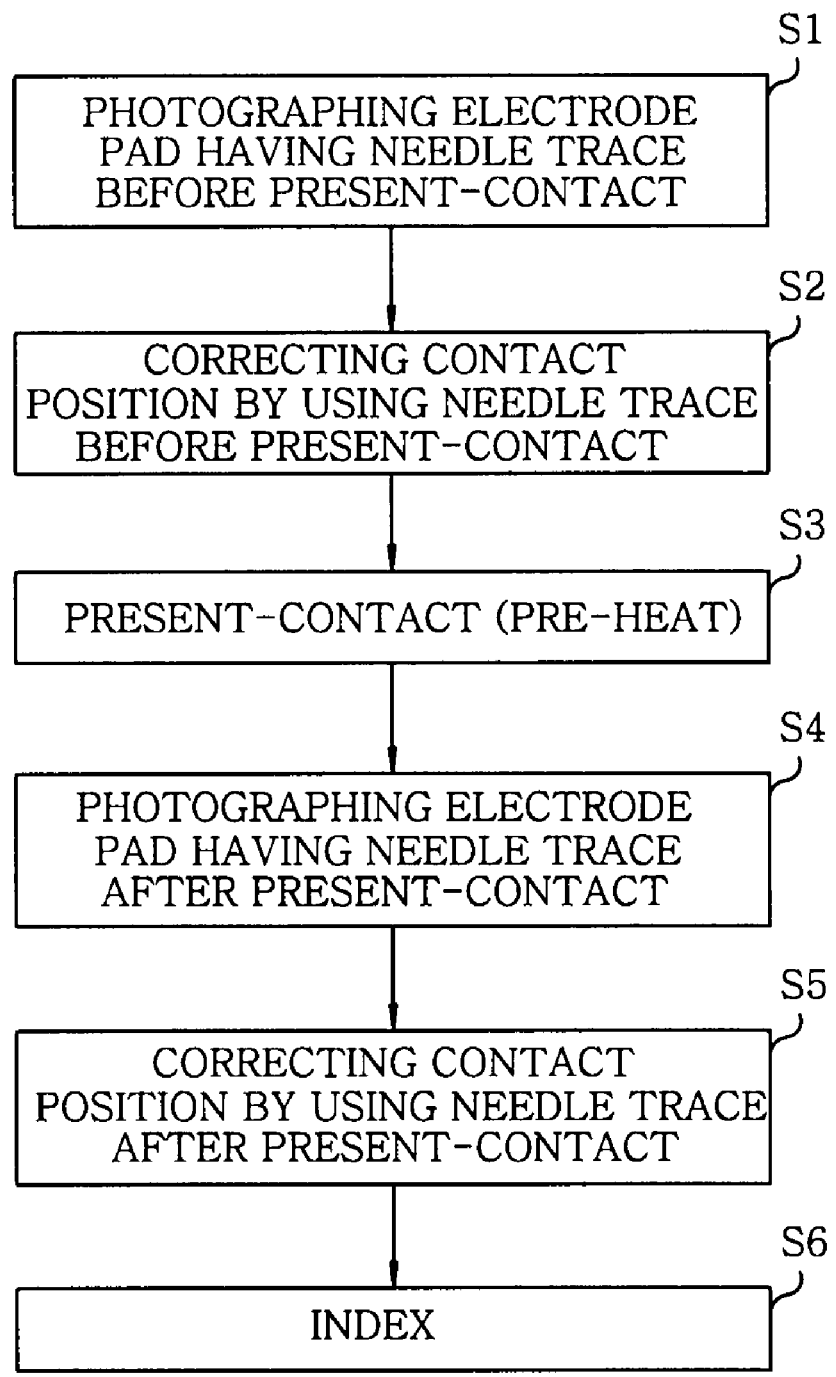
FIG. 2 is a flow chart for explaining the inspection method in accordance with the first embodiment of the present invention using the inspection apparatus shown in FIG. 1.

The inspection method of this embodiment corrects contact positions of the probes 12A in conformity with a flow chart shown in FIG. 2 for example. The following is an explanation of how to perform a high-temperature inspection of the semiconductor wafer W.

That is, as described in FIG. 2, in step S1, the CCD camera 13A photographs an image of a device D which has an electrode pad P (see FIG. 4) having an old needle trace F thereon prior to the present contact. Specifically, under the control of the control device 15, the inspection apparatus 10 transfers, by the wafer transfer mechanism, a semiconductor wafer W onto the mounting table 11 inside the prober chamber from the loader chamber, and heats the semiconductor wafer W to a predetermined level (e.g., 150° C.) by using the temperature regulation mechanism. In the meantime, the alignment bridge 13B comes forward from the rear surface of the prober chamber and stops at the probe center.

Thereafter, while the mounting table 11 moves in X and Y directions, the CCD camera 13A of the alignment bridge 13B finds a specific device D in the semiconductor wafer W at low magnification, and when the device D arrives right underneath the CCD camera 13A, the CCD camera 13A photographs the device D at high magnification in step S1. The CCD camera 13A transmits a photographed image signal to the image processing unit 15D where the photographed image is binarized based on the photographed image signal with respect to a predetermined threshold for example. The image is then stored as a first image in the image storage unit 15E. The display control unit 15F of the control device 15 is activated to display the first image in the image storage unit 15E on the display screen 14, as illustrated in FIG. 1.

Figure 4A:
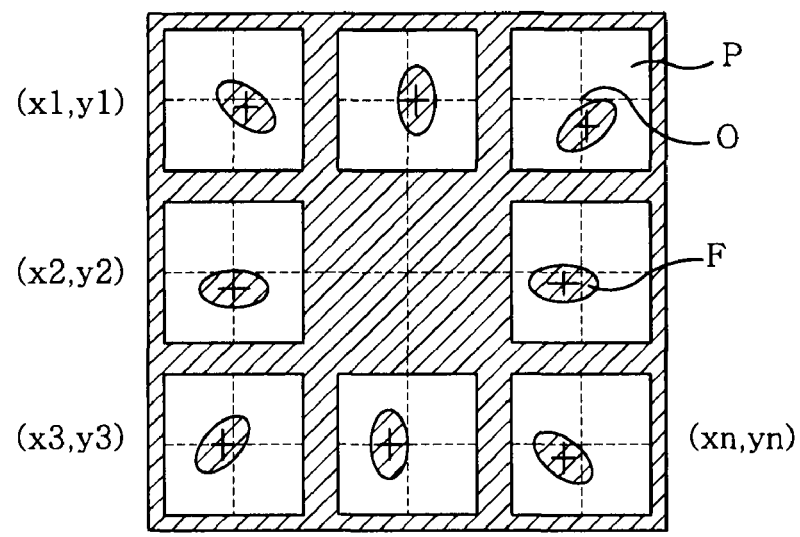

An enlarged view of the first image in FIG. 1 is shown in FIG. 4A. In FIG. 4A, the image of the device D is displayed in a binary image, the electrode pads P are indicated by white areas, and the other regions including old needle traces F are indicated by shaded areas. The two broken lines being perpendicular in each of the electrode pads P pass through the mid point of each side of the electrode pad P, and an intersection of the broken lines in the electrode pad P becomes the origin O of the xy-coordinates of the electrode pad P. Also, a cross mark of the old needle trace F indicates its center of gravity.

Figure 4B:
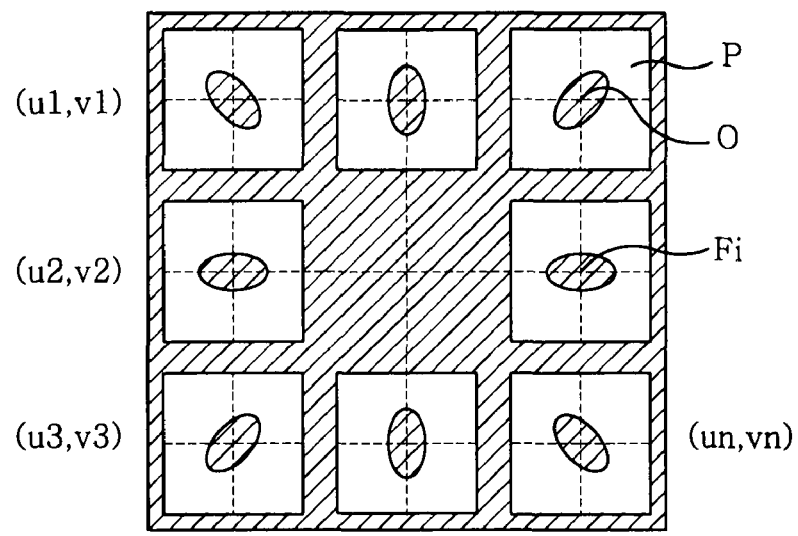

FIG. 4B shows needle traces Fi of an ideally designed probe card. Given an ideal probe card, as shown in FIG. 4B, when probes come in contact with electrode pads P, the center of gravity of each needle trace Fi coincides with the origin O of a corresponding electrode pad P. In reality, however, the probe card 12 bears a fabrication error or the like, so the position of a needle tip of each probe 12A is somewhat deviated from the origin of the electrode pad P in the X and Y directions.

Therefore, in step S2, the present inspection corrects the contact position by comparing the old needle trace F of the electrode pad P of the first image with the needle trace Fi of the ideal probe card. To perform this correction, it is necessary to obtain an amount of positional deviation between the old needle trace F of each of the probes 12A and the ideal needle trace Fi. Hence, xy coordinates of the center of gravity of the old needle trace F are defined as (xi, yi) as shown in FIG. 4A, and xy coordinates of the center of gravity of the ideal needle trace Fi are defined as (ui, vi) as shown in FIG. 4B. The semiconductor wafer W is moved in the X and Y directions by an error amount (x, y) to correct the contact position of the probe card 12. An error Lt can be obtained by the following equation (1). To do so, it is assumed there are n electrode pads P. Moreover, in FIGS. 4A and 4B, xy coordinates of the center of gravity for the respective needle traces Fi and F formed on each electrode pad D are written adjacent to each electrode pad P.

$$Lt=\Sigma((xi-(x+ui))^2+(yi-(y+vi))^2) \quad \text{Eq. (1)}$$

Here, it is desirable to get (x, y) where the error Lt has a minimum value. Since the error Lt is a quadratic function of x and y, there always exists a local minimum. Thus, this local minimum can be obtained by partially differentiating Lt with respect to x and y. Lt is partially differentiated with respect to x and y to obtain the equations (2A) and (2B) below:

$$dLt/dx=2nx+2(\Sigma(ui-xi))=0 \quad \text{Eq. (2A)}$$

$$dLt/dy=2ny+2(\Sigma(vi-yi))=0 \quad \text{Eq. (2B)}$$

From Eqs. (2A) and (2B), the following equations (3A) and (3B) can be derived. As evident from these equations, (ui-xi) and (vi-yi) are deviation amounts between the old needle trace F and the ideal needle trace Fi, so that the correction amount becomes a mean of deviation amounts of the centers of gravity of the old needle traces F of the actual probes 12A from the centers of the respective electrode pads. In order to bring the probes 12A into contact with the center of each electrode pad P in the present inspection, the center of gravity of the old needle trace F should be corrected, that is, the semiconductor wafer W should be moved in the X and Y directions by the mean of the deviation amounts. Accordingly, by taking the mean as the correction amount of the positional deviation, the center of gravity of the old needle trace F can be corrected in the present inspection. However, because the semiconductor wafer W is moved in a reverse direction to correct the positional deviation, the correction amount becomes (-x, -y).

$$x=(\Sigma(ui-xi))/n \quad \text{Eq. (3A)}$$

$$Y=(\Sigma(vi-yi))/n \quad \text{Eq. (3B)}$$

Figure 5A:
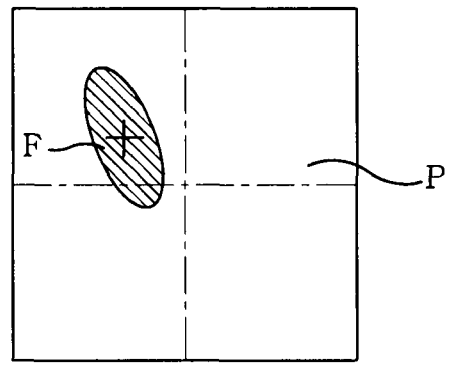
FIGS. 5A to 5C show plan views describing a process of extracting a new needle trace from a needle trace on the electrode pad of the second image by using an existing needle trace on the electrode pad of the first image.
Figure 5B:
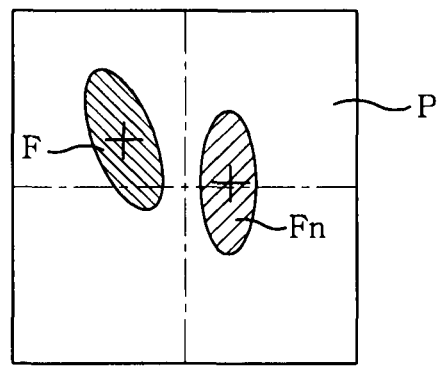
Figure 5C:
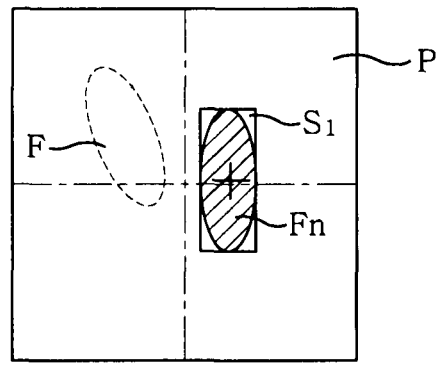

In step S2, after obtaining the correction amount in the contact position of the probe card 12, the mounting table 11 is moved in the X and Y directions by the correction amount, and thus the contact positions of the electrode pads P and the probes 12A are corrected. In this manner, alignment of the semiconductor wafer W and the probe card 12 are completed. Because all of the probes 12A are aligned, high-accuracy alignment can be realized. At the end of the alignment, the mounting table 11 is lifted until the semiconductor wafer W heated to 150° C. and the probe card 12 preheated come in contact with each other. And, in step S3, the mounting table 11 is overdriven to make electrical contact between the electrode pads P of the device D and the probes 12A so as to form new needle traces. For instance, as illustrated in FIG. 5A, the old needle trace F is formed on any electrode pad P of the first image and, as illustrated in FIG. 5B, the preheated probe card 12, i.e., the probe 12A forms a new needle trace Fn on the pad P.

Next, in step S4, the mounting table 11 descends to a predetermined position under the control of the control device 15, so the semiconductor wafer W gets distant from the probe card 12. Then, the alignment bridge 13B advances to the probe center, and the CCD camera 13A photographs an image of the electrode pad P. The CCD camera 13A transmits a photographed image signal to the image processing unit 15D wherein the photographed image is binarized. This binary image is stored in the image storage unit 15E as a second image.

After that, under the control of the control device 15, the display screen 14 displays the device D, which has electrode pads P with new needle traces Fn formed thereon, as the second image. Using the new needle traces Fn formed on the electrode pads P of the device D, the contact positions between the electrode pads P and the probes 12A are corrected for a next high-temperature inspection. Similar to step S2, in step S5, xy-coordinates of the center of gravity of the new needle trace Fn and xy-coordinates of the center of the electrode pad P are plugged into Eqs. (3A) and (3B) above to obtain the correction amount required for the next high-temperature inspection.

In this embodiment, a contactable region S of the probe 12A of the electrode pad P as well as the correction amount required for the next high-temperature inspection is obtained in conformity with the flow chart shown in FIG. 3. Moreover, it is judged whether there is an empty portion in the contactable region S for the probe 12A to contact the electrode pad P without uttermostly overlapping with the existing needle trace F. If so, the correction amount of the probe 12A which allows the probe 12A to form a needle trace in the empty portion is obtained.

Figure 6A:
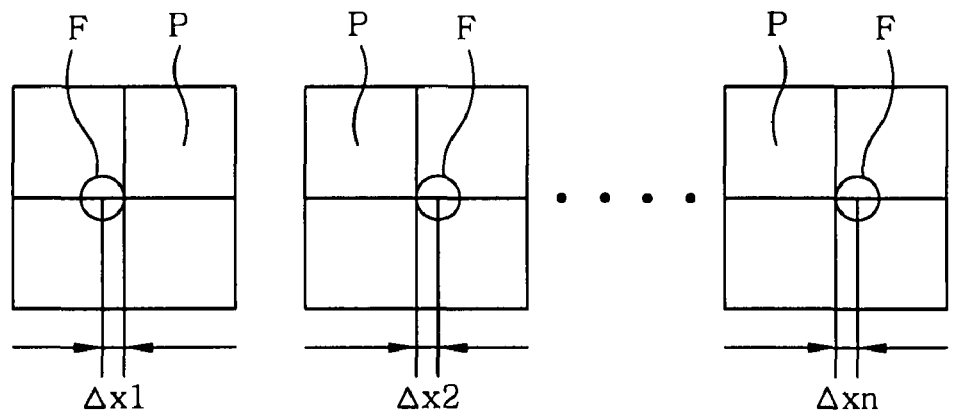
FIGS. 6A and 6B show explanatory views for explaining an inspection method in accordance with another embodiment of the present invention.
Figure 6B:
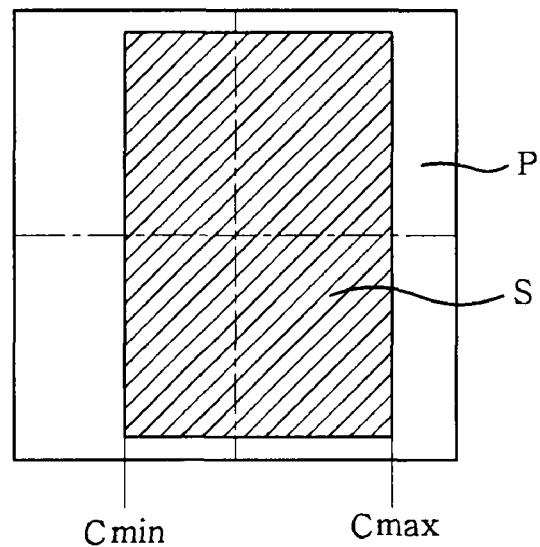

Now, an example of how to obtain the contactable region S of the probe 12A will be described with reference to FIGS. 6A and 6B. FIG. 6A illustrates a state where a vertical probe is used and the needle tip of the vertical probe is position-deviated only in the X direction and not in the Y direction. The case where the tip of the vertical probe is position-deviated only in the Y-direction not in the X-direction can be treated similarly to the above case. Although this example illustrates the formation of a circular needle trace on the electrode pad using a vertical needle by way of simplifying the method for obtaining the contactable region S, a roughly oval shape needle trace as illustrated in FIG. 4 may be formed by the cantilever type probe 12A. The fundamental principle can equally be applied to both cases.

Assuming that the needle traces F of the electrode pads P are position-deviated from the centers (the ideal needle traces) of the electrode pads P by Δx1, Δx2, .... Δxn, respectively. In the following description, Δ will be omitted. In the electrode pads P, the center of gravity of a needle trace F which is position-deviated in the X direction at a minimum amount is defined as $X_{min}=\min(x1, x2, \ldots xn)$, and the center of gravity of a needle trace F which is position-deviated in the X direction at a maximum amount is defined as $X_{max}=\max(x1, x2, \ldots xn)$.

A minimum value $C_{min}$ and a maximum value $C_{max}$ of the contactable region S of the vertical probe in the X direction and can be obtained by the following equations (4A) and (4B). In these equations, w1 indicates a width of the electrode pad P, and w2 denotes a diameter of the vertical probe. Also, it is assumed for both equations (4A) and (4B) that w1 and w2 each have a constant value. The contactable region S for the vertical probe obtained by the equations (4A) and (4B) corresponds to a shaded rectangle area in FIG. 6B. In particular, w2/2 is added or subtracted in the equations (4A) and (4B) to take the radius of the vertical probe into consideration and to ensure that the vertical probe would not get out of the passivation edge encompassing the electrode pad P.

$$C_{min}=\max(-w1/2+w2/2, -w1/2+w2/2+x_{max}) \quad \text{Eq. (4A)}$$

$$C_{max}=\min(w1/2-w2/2, w1/2-w2/2+x_{min}) \quad \text{Eq. (4B)}$$

Eqs. (4A) and (4B) are made based on an assumption of the same-sized electrode pads P and the same sized needle traces F of the probes 12A. If the electrode pads P and the needle traces F of the probes 12A each have different sizes, the following equations 4Ci and 4Di are obtained, which respectively correspond to Eqs. (4A) and (4B). In the following equations (4Ci) and (4Di), $w1_i$ indicates the width of the i-th electrode pad P, and $w2_i$ denotes the diameter of the i-th probe 12A, wherein the electrode pad P and the needle trace F of the probe 12A have their unique size and all of the sizes may be different or some of them may have the same size. If the sizes of the electrode pads P and the sizes of the needle traces F of the probes 12A are not each necessarily the same, the following equations (4Ci) and (4Di) are used to obtain the contactable region S of the i-th electrode pad P. Then, substituting the equations (4Ci) and (4Di) into the following equations (4C) and (4D) can obtain the contactable region S for every electrode pad P.

Next, the same process applied to the equations (4A) and (4B) to get the contactable region S is performed so as to carry out the flow chart that is described in FIG. 3.

$$C_{min}(i)=\max(-w1_i/2+w2_i/2, -w1_i/2+w2_i/2+x_i) \quad \text{Eq. (4Ci)}$$

$$C_{max}(i)=\min(w1_i/2-w2_i/2, w1_i/2-w2_i/2+x_i) \quad \text{Eq. (4Di)}$$

$$C_{min}=\max(C_{min}(1), C_{min}(2), C_{min}(3), \ldots, C_{min}(n)) \quad \text{Eq. (4C)}$$

$$C_{max}=\min(C_{max}(1), C_{max}(2), C_{max}(3), \ldots, C_{max}(n)) \quad \text{Eq. (4D)}$$

That is, by substituting xy-coordinates of the center of gravity of the new needle trace Fn into the equations (4A) and (4B), step S11 shown in FIG. 3 is carried out to calculate the contactable region S for the probe 12A after preheating in the high-temperature inspection. After obtaining the contactable region S, the central processing unit 15A judges in step S12 whether the contactable region S exists in the electrode pad P. If so, the probes 12A are surely in contact with all of the electrode pads P, and the inspection can be performed on the device D. However, if even a portion of the contactable region S gets out of the electrode pad P, there is any probe 12A that gets out of the electrode pad P among the probes 12A, so the high-temperature inspection cannot be performed. In this case, the control device 15 calls the attention by generating an alarm in step S12A.

Figure 7A:
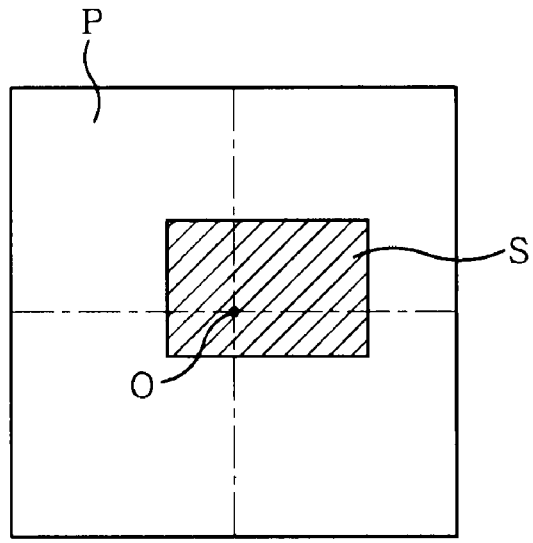
FIGS. 7A and 7B illustrate plan views showing a contactable region of a probe on an electrode pad.
Figure 7B:
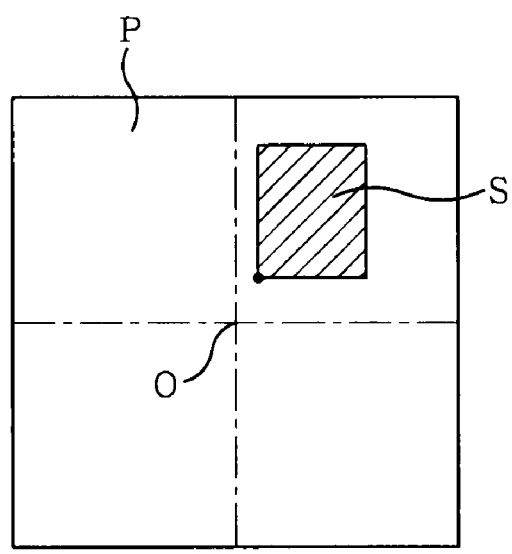

Meanwhile, as shown in FIG. 7A, if the contactable region S includes the origin C of the electrode pad P, under the control of the control device 15, the semiconductor wafer W is moved to the contact position by the correction amount as it is, which is obtained with respect to the center of gravity of the old needle trace F. In this manner, the probes 12A can be brought in contact with the centers of the respective corresponding electrode pads P for the present inspection. However, as shown in FIG. 7B, in case where the contactable region S is deviated from the center of the electrode pad P, if the aforementioned correction amount is applied without change, the probe 12A is corrected to the center of the electrode pad P deviated from the contactable region S and any one of the probes 12A gets deviated from the contactable region S. As a result, the high-temperature inspection cannot be performed. Thus, in such case, xy-coordinates of the closest contactable region S to the center of the electrode pad P are added to the correction amount as an offset to cause the semiconductor wafer W to move accordingly such that the probes 12A can contact the centers of the respective corresponding electrode pads P for the present inspection. Meanwhile, if the contactable region S is not formed or if the electrode pad is smaller than a predetermined size, the given correction amount is not suitable. In this case, an alarm is generated to call attention. The contactable region S can also be used even for the present, high-temperature inspection.

If the contactable region S is formed within the electrode pad P, the present, high-temperature inspection can be performed. Also, the correction amount used for the next high-temperature inspection can be obtained. This correction amount is defined as a second correction amount. In case the second correction amount is obtained in preparation for the next high-temperature inspection, the second correction amount can be obtained by using the new needle trace Fn formed in the present, high-temperature inspection, as has been done to the old needle trace F. That is, the center of gravity of the new needle traces Fn of the probes 12A is first obtained, and the coordinates of the center of gravity of the new needle traces Fn are plugged into Eqs. (3A) and (3B) to calculate the second correction amount.

As illustrated in FIG. 5B, the new needle trace Fn is formed close to the old needle trace F. Since the new needle trace Fn shown therein does not overlap with the old needle trace F, it is possible to find the center of gravity of the new needle trace Fn, as in the old needle traces F. However, if the new needle trace Fn overlaps in part with the old needle trace F, it becomes impossible to find the center of gravity of the new needle trace Fn. In this case, for example, the technique disclosed in Japanese Patent Laid-open Publication No. 2006-278381, which was also suggested by the present inventors, can be applied. In this embodiment, a description is made under the assumption that the new needle traces Fn do not overlap with the old needle traces F.

However, in a case illustrated in FIG. 5B, it is difficult to distinguish the new needle trace Fn from the old needle trace F. Therefore, in this embodiment, both the binarized first image containing the old needle trace F photographed in step S2 and the binarized second image containing the old and new needle traces F and Fn are utilized to extract only a new needle trace Fn in step S13. That is, under the control of the control device 15, the central processing unit 15A reads the first and second images from the image storage unit 15E and obtains a difference in the first image from the second image. By doing so, as indicated by broken lines in FIG. 5C, the old needle trace F disappears and only the new needle trace Fn is extracted. Based on this extracted image (hereinafter, referred to as "extracted image"), the center of gravity of the new needle trace Fn can be obtained. Indeed, the new needle traces Fn can be obtained for all of the probes 12A.

Figure 8A:
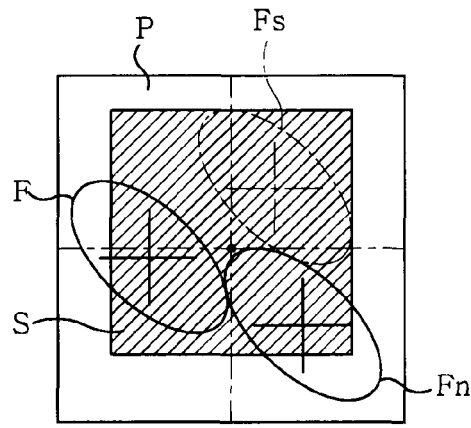
FIGS. 8A to 8C show a relationship between a contactable region of a probe on an electrode pad and a probe arrangement region assigned for a next inspection.
Figure 8B:
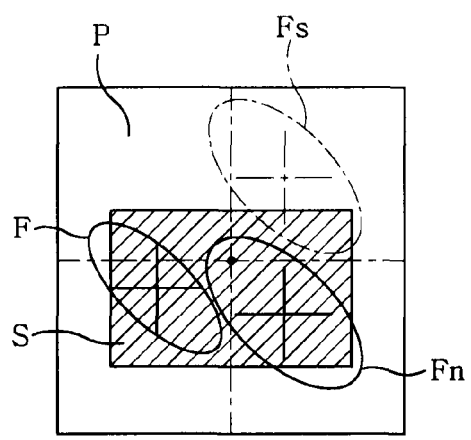
Figure 8C:
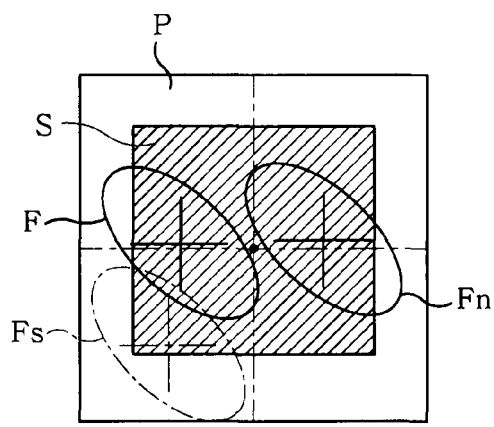

Next, as illustrated in FIG. 8A, the contactable region S and an expected contact position Fs, which is expected to be obtained by correcting contact position of each of the probes 12A with each of the electrode pads P to the center of each electrode pad P based on the correction amount obtained in step S5, are applied to the second image, and it is in step S14 judged whether the center of gravity of the expected contact position Fs is within the contactable region S of the electrode pad P and whether the expected contact position Fs is within an empted area which does not have either old needle trace F nor the new needle trace Fn. If the extracted image can be arranged in such an empty area within the contactable region S, the expected contact position Fs is arranged accordingly in step S15, and the center of gravity of the expected contact position Fs is obtained in that position in step S16. Meanwhile, if the center of gravity of the expected contact position Fs does not satisfy the above conditions and if the center of gravity of the expected contact position Fs gets out of the contactable region S even when the expected contact position Fs is within the empty area of the electrode pad P as depicted in FIG. 8B, it indicates that there is any probe 12A causing a contact error, making it impossible to perform the high-temperature inspection. In this case, an alarm is generated to call attention in step S14A. Referring now to FIG. 8C, if the center of gravity of the expected contact position Fs is located within the contactable region S but cannot be arranged in an empty area, the expected contact position Fs needs to be arranged in a manner to uttermostly diminish the overlap between the existing old needle trace F and the new needle trace Fn. At this time, it is set that an alarm is generated to call attention and notify that the expected contact position Fs cannot be arranged in the empty area. In response to such attention using alarm, the expected contact position Fs is preferably arranged properly to uttermostly diminish the overlap.

Once the center of gravity of the expected contact position Fs is obtained in this way, these data are stored and kept in the image storage unit 15E. These data are utilized later when the next high-temperature inspection is performed. If the next high-temperature inspection is to be performed by another inspection apparatus, the data can be given to the apparatus by means of a communication medium or a magnetic storage medium.

When the above-described operation is over, the inspection apparatus 10, under the control of the control device 15, executes index transfer of the semiconductor wafer W through the mounting table 11 to perform the present high-temperature inspection. When the high-temperature inspection on a single semiconductor wafer W is completed, a next semiconductor wafer W is placed on the mounting table 11. Since the next semiconductor wafer W is identical to the previous semiconductor wafer W, its alignment is omitted and index transfer of the semiconductor wafer W is executed right away to perform the high-temperature inspection.

As explained earlier, the present, high-temperature inspection in accordance with this embodiment includes a process of correcting contact positions between the electrode pads P of the semiconductor wafer W and the probes 12A in preparation for the inspection, using old needle traces F of the probes 12A that are formed on the electrode pads P, respectively, through an electrical characteristic inspection of devices D in the semiconductor wafer W performed by making electrode pads of the semiconductor wafer W placed on the mounting table 11 electrically contact the probes 12A of the probe card 12 arranged above the mounting table 11. Here, the process of correcting contact positions between the electrode pads P and the probes 12A in preparation for inspection includes the steps of: obtaining a first image by photographing the electrode pads P to detect the old needle trace F formed on each of the electrode pads P; obtaining an amount of positional deviation between the center of each of the electrode pads P and the center of gravity of each of the old needle traces F on the electrode pads P by using the first image; correcting contact positions of the probes 12a used for the present inspection with the electrode pads P to the center of the electrode pads P, respectively, by using the center of gravity of the old needle traces F and the amount of positional deviation thereof; bringing the probes 12A and the electrode pads P that are used for the present inspection after the correction in contact with each other to form new needle traces Fn on the respective electrode pads P; obtaining a second image by photographing the electrode pads P on which the new needle traces Fn are respectively formed; and obtaining a contactable region S for each of the probes 12A in each of the electrode pads P, based on the size of the electrode pads P and the center of gravity of the new needle trace Fn formed on each of the electrode pads P. Therefore, even if the electrode pads P are very fine, the CCD camera 13A is capable of surely detecting the old needle traces F for alignment of the probes 12 in the present inspection so as to form new needle traces Fn. Moreover, the new needle traces Fn are utilized to obtain a contactable region S for each of the probes 12A, and to make electrical contact between the electrode pads P and their corresponding probes 12A, thereby making sure to perform the high-temperature inspection of high reliability.

In addition, in accordance with this embodiment, the process of correcting contact positions between the electrode pads P and the probes 12A in preparation for inspection includes the steps of: obtaining a first image by photographing the electrode pads P to detect the old needle trace F formed on each of the electrode pads P; obtaining an amount of positional deviation between the center of each of the electrode pads P and the center of gravity of each of the old needle traces F on the electrode pads P by using the first image; correcting contact positions of the probes 12A used for the present inspection with the electrode pads P to the center of the electrode pads P, respectively, by using the center of gravity of the old needle traces F and the amount of positional deviation thereof; bringing the probes 12A and the electrode pads P that are used for the present inspection after the correction in contact with each other to form new needle traces Fn on the respective electrode pads P; obtaining a second image by photographing the electrode pads P on which the new needle traces Fn are respectively formed; and comparing the first image with the second image to extract an image of the new needle trace Fn of each of the electrode pads P, obtaining expected contact positions for the probes to make contact during a next inspection by using an amount of positional deviation between the center of each of the electrode pads and the center of gravity of each of the new needle traces on the electrode pads, comparing the expected contact position Fs with an empty area with no needle trace of the second image, and, if the extracted images Fs are included in the respective empty areas, arranging the expected contact positions Fs in the respective empty areas to obtain the centers of gravity thereof; and correcting the contact position of each of the probes 12A to the center of gravity of each of the expected contact positions Fs arranged in the respective empty areas. Therefore, even if the electrode pads P become finer, the probes 12A can surely come in contact with the empty areas of the corresponding electrode pads P, respectively, for the next high-temperature inspection, by utilizing the old needle traces F formed on the electrode pads P. As a result, every electrode pad P is protected against damage, and high-temperature inspection of high reliability can be performed.

Furthermore, in accordance with this embodiment, if the contactable regions S are respectively included in the electrode pads P, the inspection method further includes the steps of: obtaining expected contact positions Fs of the new needle traces within the electrode pads P extracted from the first image and the second image; comparing the expected contact positions Fs with empty areas with no needle trace, respectively, and the empty areas being respectively included in the contactable regions S of the electrode pads, and if the expected contact positions Fs are included in the respective empty areas, arranging the expected contact positions Fs in the respective empty areas, and obtaining the centers of gravity thereof; and correcting the contact positions of the probes 12A to the centers of gravity of the expected contact positions arranged in the empty areas, respectively. Therefore, the probes 12A can surely come in contact with the empty areas of the corresponding electrode pads P, respectively, for the next high-temperature inspection. As a result, every electrode pad P is protected against damage, and high-temperature inspection of high reliability can be performed.

Second Embodiment

Now, there will be described with reference to FIGS. 9 to 13 an inspection method in accordance with a second embodiment of the present invention wherein the probe 12A can efficiently contacting with the electrode pad P in an empty area formed between needle traces on the electrode pad P. The empty area indicates an area in the electrode pad P, wherein the probe 12A comes in contact with the electrode pad P without being overlapped with the existing needle trace. When there are needle traces and the probe 12A cannot contact the electrode pad P without being overlapped with the existing needle trace, it is needed to find an optimal position as an expected contact position where the overlap with the existing needle trace is minimized. By suppressing the overlap with the existing needle trace to the minimum, the electrode pads and the devices are protected against damages. Here, the expected contact position can be obtained by following the procedure used for the first embodiment. Meanwhile, FIGS. 9 to 14 illustrate circumscribed rectangles in place of needle traces.

There are two methods to find an empty area. The first method is to move the probe 12A to a position closest to the expected contact position that is a position where the overlap with the existing needle trace in the electrode pad becomes a minimum. The second method is to move the probe 12A to a position closest to the expected contact position that is a position where the overlap with the existing needle trace in the electrode pad is the minimum after maintaining the positional relationship with the existing needle traces around the expected contact position.

Figure 9A:
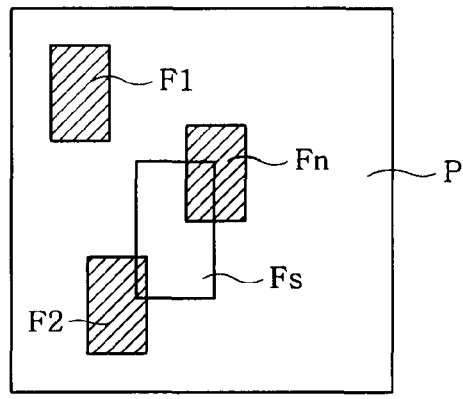
FIGS. 9A to 9C are plan views for explaining a method for optimally arranging an expected contact position of a probe in an empty region within an electrode pad.

For instance, as illustrated in FIG. 9A, two existing old needles traces (indicated by a circumscribed rectangle of the needle trace) F1 and F2 and a new needle trace (indicated by a circumscribed rectangle of the needle trace) Fn obtained by correcting the contact position of the probe 12A for the present inspection based on the one old needle trace are formed in the electrode pad P, and by correcting the position of the new needle trace Fn in the same manner as in the first embodiment based on the amount of positional deviation between the center of gravity of the new needle trace Fn and the center of the electrode pad P, the expected contact position (indicated by a circumscribed rectangle of the needle trace) Fs of the probe 12A is obtained for the next inspection. This expected contact position Fs is partially overlapped with the old needle trace F2 and the new needle trace Fn, as shown in FIG. 9A. Thus, in this embodiment, the position where the overlap of the expected contact position Fs with the old and new needle traces F2 and Fn becomes a minimum is corrected as an optimal position Fc of the expected contact position Fs.

Figure 9B:
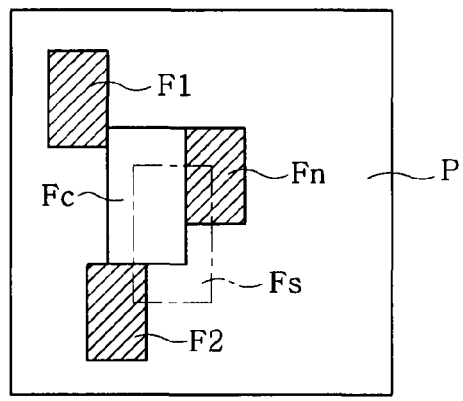
Figure 9C:
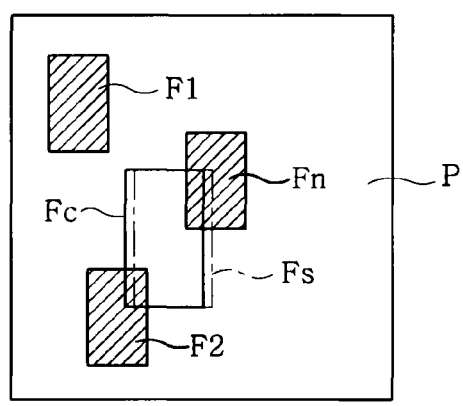

In the first method, the optimal position (with no overlap between the existing needle traces F1, F2, and Fn) Fc which is not overlapped with any needle trace is found in the entire electrode pad P as shown in FIG. 9B, and the position is set to the expected contact position Fa for the next inspection. In this case, there is no overlapped portion. However, this method has a problem that empty areas are reduced at once when the next inspection is performed.

Meanwhile, the second method obtains an empty area while maintaining the positional relationship between the existing old needle trace F2 and the new needle trace Fn, and corrects the expected contact position Fs to the optimal position Fc. By uttermostly diminishing the overlap between the expected contact position Fs and the existing needle traces F2 and Fn, the electrode pad P is protected against damage. Even in case of obtaining an empty area, it is preferable to have the optimal position Fc as close as possible to the expected contact position Fs. This is because after the probe 12A contacts the optimal position Fc, the contact position may be restored to the expected contact position Fs and the probe 12A may contact another position, and because free contact is not always done in an empty area. Thus, the second method will be explained below in detail with reference to FIGS. 10 to 13.

Figure 10A:
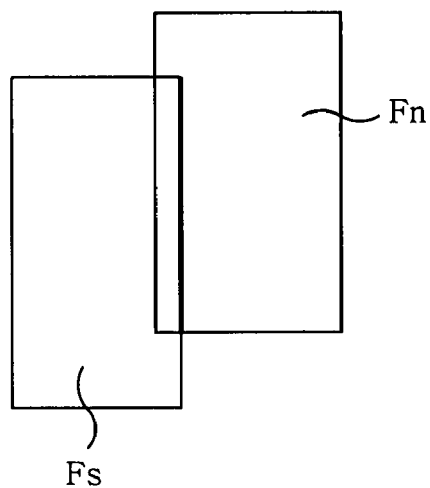
FIGS. 10A and 10B are plan views for explaining a state where an expected contact position of a probe overlaps with an existing needle trace.
Figure 10B:
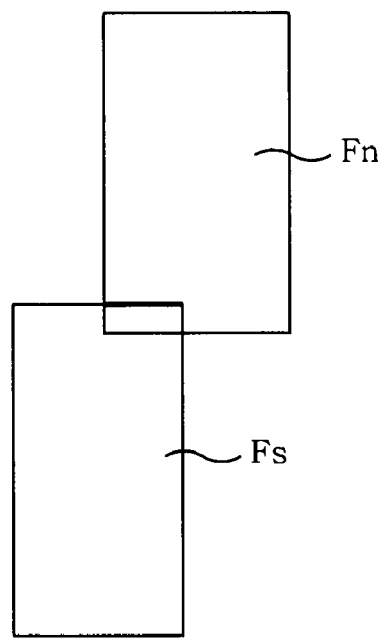
Figure 11A:
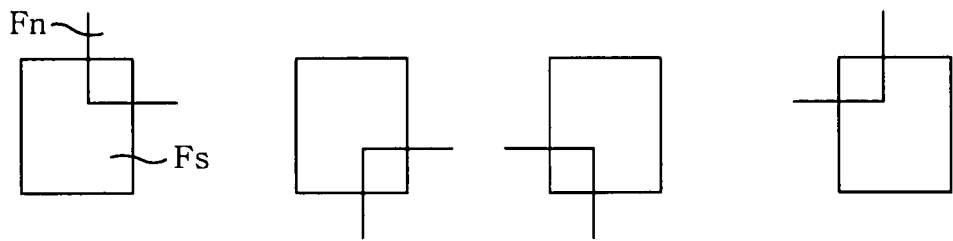
FIGS. 11A to 11D are plan views for explaining a state where an expected contact position of a probe overlaps with an existing needle trace.
Figure 11B:
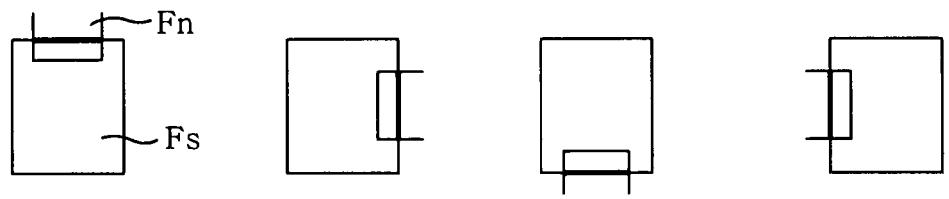
Figure 11C:
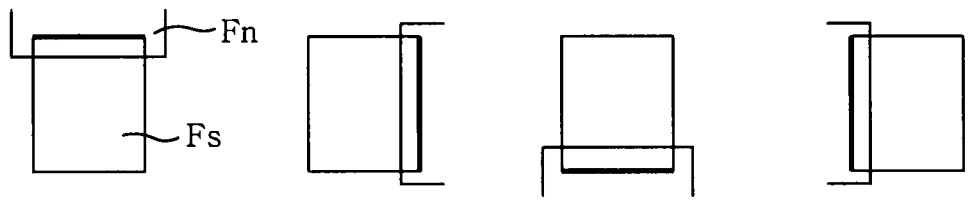
Figure 11D:
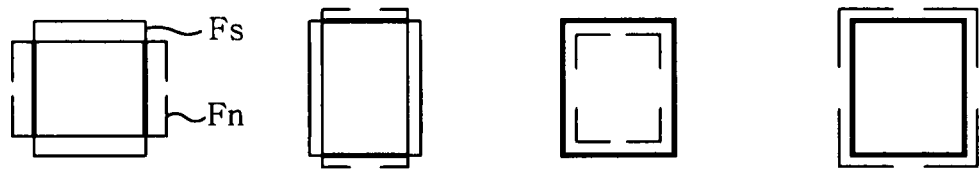
Figure 12A:
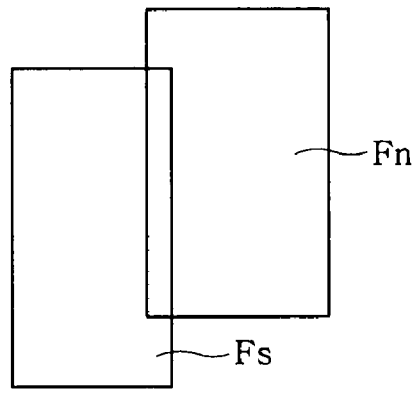
FIGS. 12A and 12B are plan views for explaining a method for correcting an expected contact position of a probe by shifting the expected contact position to an optimal position.
Figure 12B:
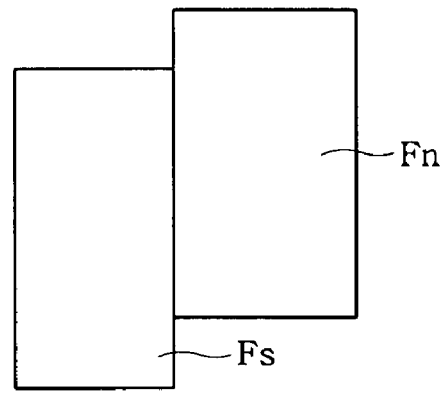

In order to obtain the optimal position Fc in an empty area from the expected contact position Fs, it is assumed that the expected contact position Fs having been corrected based on the amount of positional deviation between the center of gravity of the existing new needle trace Fn and the center of the electrode pad P is partially overlapped with the existing new needle trace Fn, as illustrated in FIGS. 10A and 10B for example.

In this method, it is examined whether there is overlap between the expected contact position Fs and the new needle trace Fn in FIGS. 10A and 10B. For instance, it is specified whether any side of the expected contact position Fs overlaps with the new needle trace Fn. Among the overlapped sides of the expected contact position Fs, a more overlapped side is defined as a target intercept. In FIG. 10A, the intercept on the right side indicated by a bold line of the expected contact position Fs is greater than the intercept on the upper side, so the intercept on the right side indicated by the bold line becomes the target intercept. Meanwhile, in FIG. 10B, the intercept on the upper side indicated by a bold line of the expected contact position Fs is greater than the intercept on the right side, so the intercept on the upper side indicated by the bold line becomes the target intercept. The target intercept can have various patterns as shown in FIGS. 11A to 11D, besides the ones in FIGS. 10A and 10B.

In order to make the overlap minimum or zero while maintaining the positional relationship between the expected contact position Fs and the new needle position Fn, the expected contact position Fs needs to move with reference to the overlapped portion of another side in perpendicular to the target intercept. Consequently, the overlap of the expected contact position Fs becomes a minimum or zero. In the case shown in FIG. 10A, when the expected contact position Fs is moved leftward by the overlapped amount of another side, from the position shown in FIG. 12A to the position shown in FIG. 12B, the overlap becomes zero. In the case shown in FIG. 10B, the overlap becomes zero by moving the expected contact position Fs downward by the overlapped amount of another side. The pattern in FIG. 11A includes the pattern in FIG. 10, and the expected contact position Fs can be corrected to an optimal position based on the target intercept. Also, the patterns in FIGS. 11B and 11C each include one target intercept, so the expected contact position Fs can be corrected to an optimal position. On the other hand, the pattern in FIG. 11D has plural target intercepts, so an optimal position cannot be set. Therefore, in the case of the pattern shown in FIG. 11D, correction of the expected contact position to an optimal position is not made.

Figure 13:
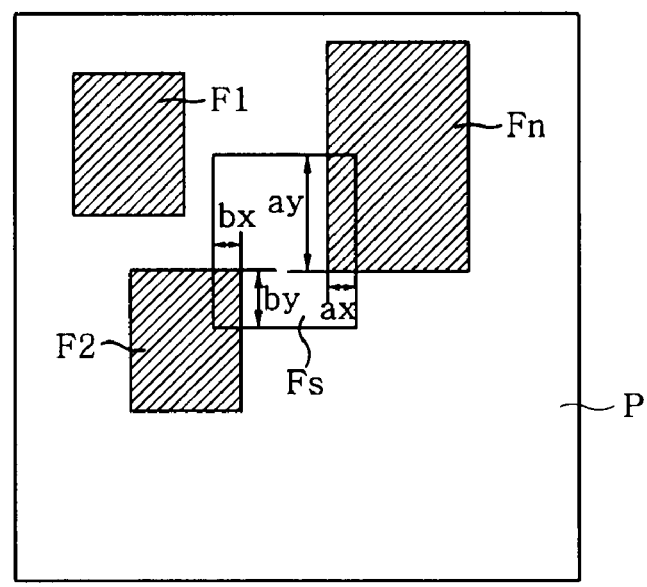
FIG. 13 is a plan view for explaining in more detail a method for correcting an expected contact position of a probe by shifting the expected contact position to an optimal position.

In addition, as shown in FIG. 9A and FIG. 13, if the expected contact position Fs is overlapped with the old needle trace F2 and the new needle trace Fn, it cannot be moved to make the overlap zero. In this case, the expected contact position Fs is moved in a way that the target intercept shifts to its perpendicular direction so as to balance the overlap on both sides. By balancing the overlap on both sides, damages on the needle traces of both sides can be reduced. Referring to FIG. 13, it is assumed that the length of a target intercept between the expected contact position Fs and the new needle trace Fn is 'ay', the length of another overlapped side is 'ax', the length of a target intercept between the expected contact position Fs and the old needle trace F2 is 'by', and the length of another overlapped side is 'bx'. Then, the movement amount x in the X direction can be obtained as follows:

$SL$(Overlapped area with the old needle trace after movement)$=(bx-x) \times by$ $SR$(Overlapped area with the new needle trace after movement)$=(ax+x) \times ay$ Here, x is derived from the relation of $SL=SR$.

$(bx-x) \times by = (ax+x) \times ay.$

Therefore, the movement amount $x=(bx \cdot by - ax \cdot ay)/(ay+by)$

After obtaining the movement amount in the X direction in this way, the movement amount in the Y direction is obtained in the same manner so as to optimize the expected contact position Fs.

It is also possible to calculate a movement amount to minimize the total overlapped area on both sides, rather than to balance the overlapped amount on both sides, or to calculate a movement amount to balance the overlap width (ax, bx in FIG. 13).

As noted above, for optimal movement of the expected contact position in the X direction, it is useful to plot a directed graph to show an adjacent relationship (hereinafter, referred to as "adjacent relationship graph") of existing values in advance, with the existing needle trace and the expected contact position as nodes. Then, the existing needle trace related to the expected contact position Fs is specified, and an evaluation such as the overlap width with the existing needle trace can be obtained from the graph.

Figure 14:
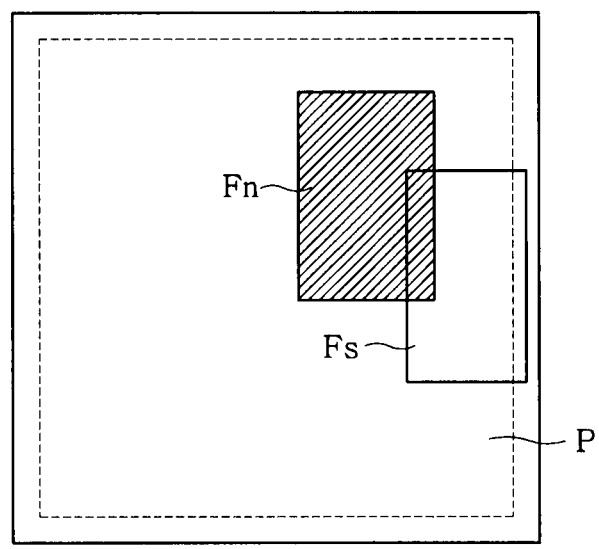
FIG. 14 is a plan view for explaining a method for correcting an expected contact position of a probe by shifting an expected contact position caught in the passivation layer to an optimal position.

In case the expected contact position Fs overlaps with both the new needle trace Fn as well as the passivation edge as shown in FIG. 14, by using the same method described above, the expected contact position Fs can be moved to an optimal position between the new needle trace Fn and the passivation, by considering the inner side at a distance away from the passivation edge similar to the sides of a circumscribed rectangle of the existing needle trace. In addition, if it is required to separate the side from the passivation edge by a specific distance or more, the requirement has to be met first, and then a movement amount to minimize the overlap with the existing new needle trace Fn should be obtained. Also, in FIG. 14, outside of the broken lines is a passivation layer.

So far, this embodiment has explained about a method for calculating a movement amount using the circumscribed rectangle of a needle trace when the expected contact position Fs needs to move to the optimal position Fc. However, the overlap portion may be calculated by bitmap computations using a binary image indicative of an actual needle trace region.

As explained so far, this embodiment, in conformity with the procedure of the first embodiment, suggests that, as a post-process after obtaining the expected contact position Fs for the probes 12A to contact during the next inspection, each of the expected contact positions Fs is corrected by moving its target intercept to a position, where the overlap between the extracted image (circumscribed rectangle) Fn of each of the needle traces arranged at the respective expected contact positions Fs and the existing needle trace (circumscribed rectangle) F1 is a minimum, in the perpendicular direction by a minimum distance. Thus, the expected contact position Fs can be arranged in an empty area more efficiently, which leads to the suppression of damages on the existing needle traces F1 and Fn and further the suppression of damages on the devices, as well as to the same operation effects as those in the first embodiment.

Third Embodiment

Figure 15A:
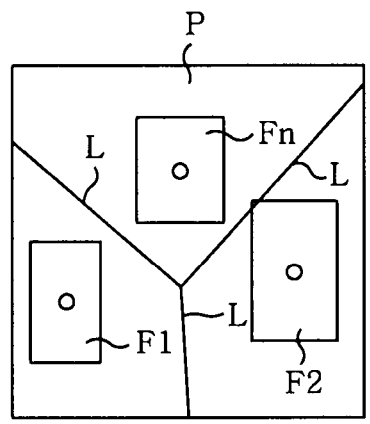
FIGS. 15A and 15B are plan views for explaining another method for correcting an expected contact position of a probe by shifting the expected contact position to an optimal position.
Figure 15B:
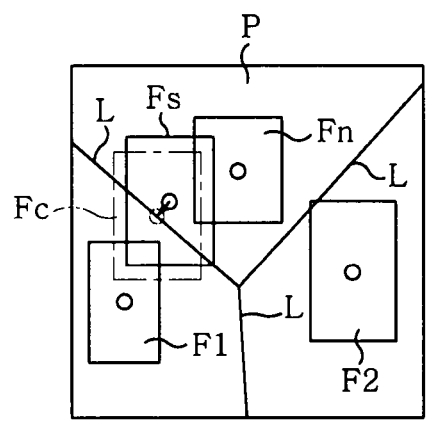

In this embodiment, a Voronoi diagram is plotted with respect to the center of gravity of an existing needle trace, as shown in FIGS. 15A and 15B. Similar to the second embodiment, the needle trace in this embodiment takes the form of a circumscribed rectangle of a needle trace. A Voronoi diagram is a set of regions that are classified according as which point equidistant in the space is closest to a given mother point out of points (mother points) that are arranged at random positions in a random distance space. The border of the regions becomes a part of the line bisector of the mother point in each region. As shown in FIG. 15A, the Voronoi border L lies farthest from the centers of gravity of the existing needle traces F1, F2 and Fn. As shown in FIG. 15B, a position closest to the Voronoi border L from the center of gravity of an expected contact position Fs that is obtained based on the new needle trace Fn becomes an optimal position Fc after optimization.

Unlike the second embodiment where the expected contact positions Fs of the probe 12 are efficiently arranged in empty areas using the circumscribed rectangles of the needle traces µl and Fs, this embodiment can efficiently arrange the expected contact positions Fs by using Voronoi diagrams of the existing needle traces F1, F2 and Fn, and can also have the same operation effects as those in the second embodiment.

While this embodiment has explained about the inspection of an object at high temperature, it should be noted that it is applicable to any other kinds of inspections. Moreover, the present invention is not limited to the embodiments described above, and, if necessary, its elements may be properly modified.

The present invention can be advantageously used for any inspection apparatus for performing an electrical characteristic inspection of a target object such as a semiconductor wafer.

While the invention has been shown and described with respect to the preferred embodiments, it will be understood by those skilled in the art that various changes and modification may be made without departing from the scope of the invention as defined in the following claims.

What is claimed is:

1. An inspection method for inspecting electrical characteristics of a target object by bringing electrode pads of the target object placed on a mounting table in electrical contact with probes of a probe card arranged above the mounting table, the method comprising:

a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection comprising:

a first step of obtaining a first image by photographing the electrode pads to detect the needle trace formed on each of the electrode pads;

a second step of obtaining an amount of positional deviation between the center of each of the electrode pads and the center of gravity of each of the needle traces on the electrode pads by using the first image;

a third step of correcting contact positions of the probes used for the present inspection with the electrode pads to the centers of the electrode pads, respectively, by using the positions of the needle traces and the amount of positional deviation thereof;

a fourth step of bringing the probes that are used for the present inspection in contact with the electrode pads after the correction in the third step to form a new needle trace on each of the electrode pads;

a fifth step of obtaining a second image by photographing the electrode pads on which the new needle traces are respectively formed; and a sixth step of obtaining a contactable region for each of the probes in each of the electrode pads, based on size of the electrode pads and center of gravity of the new needle trace formed on each of the electrode pads.

2. The method of claim 1, wherein the new needle trace is formed using the target object set to a predetermined temperature in advance.

3. The method of claim 1, wherein the amount of positional deviation obtained in the second step is calculated by a least squares method using the center of the electrode pads and the center of gravity of the needle trace formed on each of the electrode pads.

4. The method of claim 1, wherein a range of a x-coordinate of the contactable region that is obtained in the sixth step is determined by setting the center of the electrode pads as an origin, with a minimum x-coordinate being a greater x-coordinate between a corrected x-coordinate which is obtained by adding a half width of the new needle trace in the X direction to a x-coordinate of an edge on the minus side of the electrode pad and an added x-coordinate which is obtained by adding a x-coordinate of the center of gravity of the new needle trace having a maximum x-coordinate to the corrected x-coordinate, with a maximum x-coordinate being a smaller x-coordinate between a x-coordinate of an edge on the plus side of the electrode pad and an added x-coordinate which is obtained by adding a x-coordinate of the center of gravity of the new needle trace having a maximum x-coordinate to the edge; and wherein a range of a y-coordinate of the contactable region is determined in a similar manner used for the x-coordinate range.

5. An inspection method for inspecting electrical characteristics of a target object by bringing electrode pads of the target object placed on a mounting table in electrical contact with probes of a probe card arranged above the mounting table, the method comprising:

a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection comprising:

a first step of obtaining a first image by photographing the electrode pads to detect the needle trace formed on each of the electrode pads;

a second step of obtaining an amount of positional deviation between the center of each of the electrode pads and the center of gravity of each of the needle traces on the electrode pads by using the first image;

a third step of correcting contact positions of the probes used for the present inspection with the electrode pads to the centers of the electrode pads, respectively, by using the positions of the needle traces and the amount of positional deviation thereof;

a fourth step of bringing the probes that are used for the present inspection in contact with the electrode pads after the correction in the third step to form a new needle trace on each of the electrode pads;

a fifth step of obtaining a second image by photographing the electrode pads on which the new needle traces are respectively formed;

a sixth step of comparing the first image with the second image to extract an image of the new needle trace of each of the electrode pads, obtaining expected contact positions for the probes to make contact during a next inspection by using an amount of positional deviation between the center of each of the electrode pads and the center of gravity of each of the new needle traces on the electrode pads, comparing the expected contact positions with respective empty areas with no needle trace of the corresponding second image, and, if the expected contact positions are included in the respective empty areas, arranging the expected contact positions in the respective empty areas to obtain the centers of gravity thereof; and a seventh step of correcting the contact position of each of the probes to the center of gravity of each of the expected contact positions arranged in the respective empty areas.

6. The method of claim 5, wherein the new needle trace is formed using the target object set to a predetermined temperature in advance.

7. The method of claim 5, wherein the amount of positional deviation obtained in the second step is calculated by a least squares method using the center of the electrode pads and the center of gravity of the needle trace formed on each of the electrode pads.

8. An inspection method for inspecting electrical characteristics of a target object by bringing electrode pads of the target object placed on a mounting table in electrical contact with probes of a probe card arranged above the mounting table, the method comprising:

a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection comprising:

a first step of obtaining a first image by photographing the electrode pads to detect the needle trace formed on each of the electrode pads;

a second step of obtaining an amount of positional deviation between the center of each of the electrode pads and the center of gravity of each of the needle traces on the electrode pads by using the first image;

a third step of correcting contact positions of the probes used for the present inspection with the electrode pads to the centers of the electrode pads, respectively, by using the positions of the needle traces and the amount of positional deviation thereof;

a fourth step of bringing the probes that are used for the present inspection in contact with the electrode pads after the correction in the third step to form a new needle trace on each of the electrode pads;

a fifth step of obtaining a second image by photographing the electrode pads on which the new needle traces are respectively formed;

a sixth step of obtaining a contactable region for each of the probes in each of the electrode pads, based on size of the electrode pads and center of gravity of the new needle trace formed on each of the electrode pads;

a seventh step of judging whether or not the contactable regions are included in the respective electrode pads;

an eighth step of extracting an image of the new needle trace of each of the electrode pads based on the first image and the second image if the contactable regions are included in the respective electrode pads; and a ninth step of obtaining expected contact positions for the probes to make contact during a next inspection by using an amount of positional deviation between the center of each of the electrode pads and the center of gravity of each of the new needle traces on the electrode pads, comparing the expected contact positions with respective empty areas with no needle trace in the contactable regions, and, if the expected contact positions are included in the respective empty areas, arranging the expected contact positions in the respective empty areas to obtain the centers of gravity thereof as contact positions for the respective probes.

9. The method of claim 8, wherein the new needle trace is formed using the target object set to a predetermined temperature in advance.

10. The method of claim 8, wherein the amount of positional deviation obtained in the second step is calculated by a least squares method using the center of the electrode pads and the center of gravity of the needle trace formed on each of the electrode pads.

11. The method of claim 8, wherein a range of a x-coordinate of the contactable region that is obtained in the sixth step is determined by setting the center of the electrode pads as an origin, with a minimum x-coordinate being a greater x-coordinate between a corrected x-coordinate which is obtained by adding a half width of the new needle trace in the X direction to a x-coordinate of an edge on the minus side of the electrode pad and an added x-coordinate which is obtained by adding a x-coordinate of the center of gravity of the new needle trace having a maximum x-coordinate to the corrected x-coordinate, with a maximum x-coordinate being a smaller x-coordinate between a x-coordinate of an edge on the plus side of the electrode pad and an added x-coordinate which is obtained by adding a x-coordinate of the center of gravity of the new needle trace having a maximum x-coordinate to the edge; and wherein a range of a y-coordinate of the contactable region is determined in a similar manner used for the x-coordinate range.

12. An inspection method for inspecting electrical characteristics of a target object by bringing electrode pads of the target object placed on a mounting table in electrical contact with probes of a probe card arranged above the mounting table, the method comprising:

a process of correcting contact positions between the electrode pads and the probes in preparation for a present inspection, using needle traces of the probes that are formed on the electrode pads, respectively, in a previous inspection, wherein the process of correcting contact positions between the electrode pads and the probes in preparation for the present inspection comprising:

a first step of obtaining a first image by photographing the electrode pads to detect the needle trace formed on each of the electrode pads;

a second step of obtaining an amount of positional deviation between the center of each of the electrode pads and the center of gravity of each of the needle traces on the electrode pads by using the first image;

a third step of correcting contact positions of the probes used for the present inspection with the electrode pads to the centers of the electrode pads, respectively, by using the positions of the needle traces and the amount of positional deviation thereof;

a fourth step of bringing the probes that are used for the present inspection in contact with the electrode pads after the correction in the third step to form a new needle trace on each of the electrode pads;

a fifth step of obtaining a second image by photographing the electrode pads on which the new needle traces are respectively formed; and a sixth step of comparing the first image with the second image to extract an image of the new needle trace of each of the electrode pads, obtaining expected contact positions for the probes to make contact during a next inspection, by following similar procedures to the first to third steps based on the center of gravity of each of the extracted images and the center of each of the electrode pads.

13. The method of claim 12, wherein the process of correcting contact positions further comprises a seventh step of correcting the expected contact position by moving it by a minimum distance to a position where the overlap becomes a minimum if the extracted image arranged at each of the expected contact positions overlaps with the existing needle traces.

14. The method of claim 13, wherein the new needle trace is formed using the target object set to a predetermined temperature in advance.

15. The method of claim 13, wherein the amount of positional deviation obtained in the second step is calculated by a least squares method using the center of the electrode pads and the center of gravity of the needle trace formed on each of the electrode pads.

16. The method of claim 12, wherein the process of correcting contact positions further comprises a seventh step of plotting a Voronoi diagram based on the existing needle traces in each of the electrode pads of the second image, and moving the center of gravity of each of the extracted images arranged at the respective expected contact positions to a closest Voronoi border by a minimum distance to thereby correct each of the expected contact position.

17. The method of claim 16, wherein the new needle trace is formed using the target object set to a predetermined temperature in advance.

18. The method of claim 16, wherein the amount of positional deviation obtained in the second step is calculated by a least squares method using the center of the electrode pads and the center of gravity of the needle trace formed on each of the electrode pads.

19. A non-transitory program storage medium storing a program for executing, on a computer, an inspection method for inspecting electrical characteristics of a target object by bringing electrode pads of the target object placed on a mounting table in electrical contact with probes of a probe card arranged above the mounting table, the method comprising: a process of correcting contact positions between the electrode pads and the probes in preparation for a present inspection, using needle traces of the probes that are formed on the electrode pads, respectively, in a previous inspection, wherein the program activates the computer to execute the inspection method described in claim 1, when the contact positions between the electrode pads and the respective probes are corrected using the needle traces.

20. A non-transitory program storage medium storing a program for executing, on a computer, an inspection method for inspecting electrical characteristics of a target object by bringing electrode pads of the target object placed on a mounting table in electrical contact with probes of a probe card arranged above the mounting table, the method comprising: a process of correcting contact positions between the electrode pads and the probes in preparation for a present inspection, using needle traces of the probes that are formed on the electrode pads, respectively, in a previous inspection, wherein the program activates the computer to execute the inspection method described in claim 5, when the contact positions between the electrode pads and the respective probes are corrected using the needle traces.

21. A non-transitory program storage medium storing a program for executing, on a computer, an inspection method for inspecting electrical characteristics of a target object by bringing electrode pads of the target object placed on a mounting table in electrical contact with probes of a probe card arranged above the mounting table, the method comprising: a process of correcting contact positions between the electrode pads and the probes in preparation for a present inspection, using needle traces of the probes that are formed on the electrode pads, respectively, in a previous inspection, wherein the program activates the computer to execute the inspection method described in claim 8, when the contact positions between the electrode pads and the respective probes are corrected using the needle traces.

22. A non-transitory program storage medium storing a program for executing, on a computer, an inspection method for inspecting electrical characteristics of a target object by bringing electrode pads of the target object placed on a mounting table in electrical contact with probes of a probe card arranged above the mounting table, the method comprising: a process of correcting contact positions between the electrode pads and the probes in preparation for a present inspection, using needle traces of the probes that are formed on the electrode pads, respectively, in a previous inspection, wherein the program activates the computer to execute the inspection method described in claim 13, when the contact positions between the electrode pads and the respective probes are corrected using the needle traces.

23. A non-transitory program storage medium storing a program for executing, on a computer, an inspection method for inspecting electrical characteristics of a target object by bringing electrode pads of the target object placed on a mounting table in electrical contact with probes of a probe card arranged above the mounting table, the method comprising: a process of correcting contact positions between the electrode pads and the probes in preparation for a present inspection, using needle traces of the probes that are formed on the electrode pads, respectively, in a previous inspection, wherein the program activates the computer to execute the inspection method described in claim 16, when the contact positions between the electrode pads and the respective probes are corrected using the needle traces.

* * * * *